United States Patent
Toma et al.

(10) Patent No.: US 7,270,941 B2
(45) Date of Patent: *Sep. 18, 2007

(54) METHOD OF PASSIVATING OF LOW DIELECTRIC MATERIALS IN WAFER PROCESSING

(75) Inventors: Dorel Ioan Toma, Austin, TX (US); Paul Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 152 days.

This patent is subject to a terminal disclaimer.

(21) Appl. No.: 10/379,984

(22) Filed: Mar. 4, 2003

(65) Prior Publication Data

US 2003/0198895 A1 Oct. 23, 2003

Related U.S. Application Data

(60) Provisional application No. 60/361,917, filed on Mar. 4, 2002, provisional application No. 60/369,052, filed on Mar. 29, 2002.

(51) Int. Cl.
*G03F 7/26* (2006.01)

(52) U.S. Cl. .................. 430/313; 430/329; 134/1.3

(58) Field of Classification Search ........... 430/311, 430/313, 315, 322, 324, 325, 330, 329; 134/1, 134/1.3
See application file for complete search history.

(56) References Cited

U.S. PATENT DOCUMENTS

| | | | |
|---|---|---|---|
| 2,439,689 A | 4/1948 | Hyde et al. | |
| 2,617,719 A | 11/1952 | Stewart | |
| 2,993,449 A | 7/1961 | Harland | 103/87 |
| 3,135,211 A | 6/1964 | Pezzillo | 103/87 |
| 3,642,020 A | 2/1972 | Payne | 137/122 |
| 3,646,948 A | 3/1972 | Athey | 134/57 D |
| 3,890,176 A | 6/1975 | Bolon | |
| 3,900,551 A | 8/1975 | Bardoncelli et al. | |
| 4,219,333 A | 8/1980 | Harris | |
| 4,341,592 A | 7/1982 | Shortes et al. | |
| 4,349,415 A | 9/1982 | DeFilippi et al. | |
| 4,475,993 A | 10/1984 | Blander et al. | |
| 4,730,630 A | 3/1988 | Ranft | 134/111 |
| 4,749,440 A | 6/1988 | Blackwood et al. | |
| 4,838,476 A | 6/1989 | Rahn | |
| 4,877,530 A | 10/1989 | Moses | |
| 4,879,004 A | 11/1989 | Oesch et al. | |
| 4,923,828 A | 5/1990 | Gluck et al. | |
| 4,925,790 A | 5/1990 | Blanch et al. | |
| 4,933,404 A | 6/1990 | Beckman et al. | |
| 4,944,837 A | 7/1990 | Nishikawa et al. | |
| 5,011,542 A | 4/1991 | Weil | |
| 5,013,366 A | 5/1991 | Jackson et al. | |
| 5,068,040 A | 11/1991 | Jackson | |
| 5,071,485 A | 12/1991 | Matthews et al. | |
| 5,091,207 A | 2/1992 | Tanaka | 427/8 |
| 5,105,556 A | 4/1992 | Kurokawa et al. | |
| 5,158,704 A | 10/1992 | Fulton et al. | |
| 5,174,917 A | 12/1992 | Monzyk | |
| 5,185,058 A | 2/1993 | Cathey, Jr. | |
| 5,185,296 A | 2/1993 | Morita et al. | |
| 5,196,134 A | 3/1993 | Jackson | |
| 5,201,960 A | 4/1993 | Starov | |
| 5,213,619 A | 5/1993 | Jackson et al. | |
| 5,215,592 A | 6/1993 | Jackson | |
| 5,225,173 A | 7/1993 | Wai | |
| 5,236,602 A | 8/1993 | Jackson | |
| 5,237,824 A | 8/1993 | Pawliszyn | |
| 5,238,671 A | 8/1993 | Matson et al. | |
| 5,250,078 A | 10/1993 | Saus et al. | |
| 5,261,965 A | 11/1993 | Moslehi | |
| 5,266,205 A | 11/1993 | Fulton et al. | |
| 5,269,815 A | 12/1993 | Schlenker et al. | |
| 5,269,850 A | 12/1993 | Jackson | |

(Continued)

FOREIGN PATENT DOCUMENTS

EP  0 283 740 A2  9/1988

(Continued)

OTHER PUBLICATIONS

R. F. Reidy et al., "Effects of Supercritical Procesing on Ultra Low-K Films", Dept. of Materials Science, Oct. 13, 2002, pp. 1 of 5.

(Continued)

*Primary Examiner*—Kathleen Duda
(74) *Attorney, Agent, or Firm*—Haverstock & Owens LLP

(57) ABSTRACT

A method of passivating silicon-oxide based low-k materials using a supercritical carbon dioxide passivating solution comprising a silylating agent is disclosed. The silylating agent is preferably an organosilicon compound comprising organo-groups with five carbon atoms such as hexamethyldisilazane (HMDS) and chlorotrimethylsilane (TMCS) and combinations thereof. The silicon oxide-based low-k material, in accordance with embodiments of the invention, is maintained at temperatures in a range of 40 to 200 degrees Celsius, and preferably at a temperature of about 150 degrees Celsius, and at pressures in a range of 1,070 to 9,000 psi, and preferably at a pressure of about 3,000 psi, while being exposed to the supercritical passivating solution. In accordance with further embodiments of the invention, a silicon oxide-based low-k material is simultaneously cleaned and passivated using a supercritical carbon dioxide cleaning solution.

24 Claims, 8 Drawing Sheets

U.S. PATENT DOCUMENTS

| | | |
|---|---|---|
| 5,274,129 A | 12/1993 | Natale |
| 5,285,352 A | 2/1994 | Pastore et al. |
| 5,288,333 A | 2/1994 | Tanaka et al. |
| 5,290,361 A | 3/1994 | Hayashida et al. |
| 5,294,261 A | 3/1994 | McDermott et al. |
| 5,298,032 A | 3/1994 | Schlenker et al. |
| 5,304,515 A | 4/1994 | Morita et al. |
| 5,306,350 A | 4/1994 | Hoy et al. |
| 5,312,882 A | 5/1994 | DeSimone et al. |
| 5,314,574 A | 5/1994 | Takahashi |
| 5,316,591 A | 5/1994 | Chao et al. |
| 5,320,742 A | 6/1994 | Fletcher et al. |
| 5,328,722 A | 7/1994 | Ghanayem et al. |
| 5,334,332 A | 8/1994 | Lee |
| 5,334,493 A | 8/1994 | Fujita et al. |
| 5,352,327 A | 10/1994 | Witowski |
| 5,356,538 A | 10/1994 | Wai et al. |
| 5,364,497 A | 11/1994 | Chau et al. |
| 5,370,740 A | 12/1994 | Chao et al. |
| 5,370,741 A | 12/1994 | Bergman |
| 5,370,742 A | 12/1994 | Mitchell et al. |
| 5,397,220 A | 3/1995 | Akihisa et al. ............. 417/369 |
| 5,401,322 A | 3/1995 | Marshall |
| 5,403,621 A | 4/1995 | Jackson et al. |
| 5,403,665 A | 4/1995 | Alley et al. |
| 5,417,768 A | 5/1995 | Smith, Jr. et al. |
| 5,456,759 A | 10/1995 | Stanford, Jr. et al. |
| 5,470,393 A | 11/1995 | Fukazawa |
| 5,474,812 A | 12/1995 | Truckenmuller et al. |
| 5,482,564 A | 1/1996 | Douglas et al. |
| 5,486,212 A | 1/1996 | Mitchell et al. |
| 5,494,526 A | 2/1996 | Paranjpe |
| 5,500,081 A | 3/1996 | Bergman |
| 5,501,761 A | 3/1996 | Evans et al. |
| 5,514,220 A | 5/1996 | Wetmore et al. |
| 5,522,938 A | 6/1996 | O'Brien |
| 5,547,774 A | 8/1996 | Gimzewski et al. |
| 5,550,211 A | 8/1996 | DeCrosta et al. |
| 5,580,846 A | 12/1996 | Hayashida et al. |
| 5,589,082 A | 12/1996 | Lin et al. |
| 5,589,105 A | 12/1996 | DeSimone et al. |
| 5,629,918 A | 5/1997 | Ho et al. |
| 5,632,847 A | 5/1997 | Ohno et al. |
| 5,635,463 A | 6/1997 | Muraoka |
| 5,637,151 A | 6/1997 | Schulz |
| 5,641,887 A | 6/1997 | Beckman et al. |
| 5,656,097 A | 8/1997 | Olesen et al. |
| 5,665,527 A | 9/1997 | Allen et al. |
| 5,676,705 A | 10/1997 | Jureller et al. |
| 5,679,169 A | 10/1997 | Gonzales et al. |
| 5,679,171 A | 10/1997 | Saga et al. |
| 5,683,473 A | 11/1997 | Jureller et al. |
| 5,683,977 A | 11/1997 | Jureller et al. |
| 5,688,879 A | 11/1997 | DeSimone |
| 5,700,379 A | 12/1997 | Biebl |
| 5,714,299 A | 2/1998 | Combes et al. |
| 5,725,987 A | 3/1998 | Combes et al. |
| 5,726,211 A | 3/1998 | Hedrick et al. |
| 5,730,874 A | 3/1998 | Wai et al. |
| 5,736,425 A | 4/1998 | Smith et al. |
| 5,739,223 A | 4/1998 | DeSimone |
| 5,766,367 A | 6/1998 | Smith et al. |
| 5,783,082 A | 7/1998 | DeSimone et al. |
| 5,797,719 A | 8/1998 | James et al. |
| 5,798,438 A | 8/1998 | Sawan et al. |
| 5,804,607 A | 9/1998 | Hedrick et al. |
| 5,807,607 A | 9/1998 | Smith et al. |
| 5,847,443 A | 12/1998 | Cho et al. |
| 5,866,005 A | 2/1999 | DeSimone et al. |
| 5,868,856 A | 2/1999 | Douglas et al. |
| 5,868,862 A | 2/1999 | Douglas et al. |
| 5,872,061 A | 2/1999 | Lee et al. |
| 5,872,257 A | 2/1999 | Beckman et al. |
| 5,873,948 A | 2/1999 | Kim |
| 5,881,577 A | 3/1999 | Sauer et al. |
| 5,888,050 A | 3/1999 | Fitzgerald et al. |
| 5,893,756 A | 4/1999 | Berman et al. |
| 5,896,870 A | 4/1999 | Huynh et al. |
| 5,900,354 A | 5/1999 | Batchelder |
| 5,904,737 A | 5/1999 | Preston et al. |
| 5,908,510 A | 6/1999 | McCullough et al. |
| 5,928,389 A | 7/1999 | Jevtic |
| 5,932,100 A | 8/1999 | Yager et al. |
| 5,944,996 A | 8/1999 | DeSimone et al. |
| 5,954,101 A | 9/1999 | Drube et al. |
| 5,955,140 A | 9/1999 | Smith et al. |
| 5,965,025 A | 10/1999 | Wai et al. |
| 5,976,264 A | 11/1999 | McCullough et al. |
| 5,980,648 A | 11/1999 | Adler |
| 5,992,680 A | 11/1999 | Smith |
| 5,994,696 A | 11/1999 | Tai et al. |
| 6,005,226 A | 12/1999 | Aschner et al. |
| 6,017,820 A | 1/2000 | Ting et al. |
| 6,021,791 A | 2/2000 | Dryer et al. ............. 134/100.1 |
| 6,024,801 A | 2/2000 | Wallace et al. |
| 6,037,277 A | 3/2000 | Masakara et al. |
| 6,063,714 A | 5/2000 | Smith et al. |
| 6,067,728 A | 5/2000 | Farmer et al. |
| 6,085,762 A | 7/2000 | Barton ...................... 134/25.4 |
| 6,099,619 A | 8/2000 | Lansbarkis et al. |
| 6,100,198 A | 8/2000 | Grieger et al. |
| 6,110,232 A | 8/2000 | Chen et al. |
| 6,114,044 A | 9/2000 | Houston et al. |
| 6,128,830 A | 10/2000 | Bettcher et al. |
| 6,140,252 A | 10/2000 | Cho et al. |
| 6,149,828 A | 11/2000 | Vaartstra |
| 6,171,645 B1 | 1/2001 | Smith et al. |
| 6,200,943 B1 | 3/2001 | Romack et al. |
| 6,216,364 B1 | 4/2001 | Tanaka et al. |
| 6,224,774 B1 | 5/2001 | DeSimone et al. |
| 6,228,563 B1 | 5/2001 | Starov et al. |
| 6,228,826 B1 | 5/2001 | DeYoung et al. |
| 6,232,238 B1 | 5/2001 | Chang et al. |
| 6,232,417 B1 | 5/2001 | Rhodes et al. |
| 6,235,145 B1 | 5/2001 | Li et al. ...................... 156/345 |
| 6,239,038 B1 | 5/2001 | Wen |
| 6,242,165 B1 | 6/2001 | Vaartstra ..................... 430/329 |
| 6,251,250 B1 | 6/2001 | Keigler ........................ 205/89 |
| 6,255,732 B1 | 7/2001 | Yokoyama et al. ......... 257/760 |
| 6,262,510 B1 | 7/2001 | Lungu ........................ 310/254 |
| 6,270,531 B1 | 8/2001 | DeYoung et al. ............. 8/142 |
| 6,270,948 B1 | 8/2001 | Sato et al. ................... 430/314 |
| 6,277,753 B1 | 8/2001 | Mullee et al. .............. 438/692 |
| 6,284,558 B1 | 9/2001 | Sakamoto ..................... 438/30 |
| 6,286,231 B1 | 9/2001 | Bergman et al. ............. 34/410 |
| 6,306,564 B1 | 10/2001 | Mullee ........................ 430/329 |
| 6,319,858 B1 | 11/2001 | Lee et al. .................... 438/787 |
| 6,331,487 B2 | 12/2001 | Koch ........................ 438/692 |
| 6,333,268 B1 | 12/2001 | Starov et al. |
| 6,344,243 B1 | 2/2002 | McClain et al. ......... 427/388.1 |
| 6,358,673 B1 | 3/2002 | Namatsu ..................... 430/311 |
| 6,361,696 B1 | 3/2002 | Spiegelman et al. ........ 210/662 |
| 6,367,491 B1 | 4/2002 | Marshall et al. ......... 134/104.4 |
| 6,380,105 B1 | 4/2002 | Smith et al. ................. 438/778 |
| 6,425,956 B1 | 7/2002 | Cotte et al. ..................... 134/3 |
| 6,436,824 B1 | 8/2002 | Chooi et al. ................. 438/687 |
| 6,454,945 B1 | 9/2002 | Weigl et al. ................. 210/634 |
| 6,458,494 B2 | 10/2002 | Song et al. ....................... 430/5 |
| 6,461,967 B2 | 10/2002 | Wu et al. ..................... 438/705 |
| 6,465,403 B1 | 10/2002 | Skee |
| 6,485,895 B1 | 11/2002 | Choi et al. .................. 430/311 |
| 6,486,078 B1 | 11/2002 | Rangarajan et al. ........ 438/778 |
| 6,492,090 B2 | 12/2002 | Nishi et al. .............. 430/270.1 |
| 6,500,605 B1 | 12/2002 | Mullee et al. .............. 430/329 |

| | | | |
|---|---|---|---|
| 6,509,141 B2 | 1/2003 | Mullee | 430/329 |
| 6,537,916 B2 | 3/2003 | Mullee et al. | 438/692 |
| 6,558,475 B1 | 5/2003 | Jur et al. | 134/21 |
| 6,562,146 B1 | 5/2003 | DeYoung et al. | 134/30 |
| 6,596,093 B2 | 7/2003 | DeYoung et al. | |
| 6,635,565 B2 | 10/2003 | Wu et al. | |
| 6,641,678 B2 | 11/2003 | DeYoung et al. | |
| 6,669,785 B2 | 12/2003 | DeYoung et al. | 134/3 |
| 6,764,552 B1 | 7/2004 | Joyce et al. | 134/3 |
| 6,848,458 B1 | 2/2005 | Shrinivasan et al. | 134/108 |
| 6,890,853 B2 | 5/2005 | Biberger et al. | |
| 7,044,143 B2 | 5/2006 | DeYoung et al. | 134/105 |
| 2001/0019857 A1 | 9/2001 | Yokoyama et al. | 438/142 |
| 2001/0024247 A1 | 9/2001 | Nakata | 349/43 |
| 2001/0041455 A1 | 11/2001 | Yun et al. | 438/745 |
| 2001/0041458 A1 | 11/2001 | Ikakura et al. | 438/778 |
| 2002/0001929 A1 | 1/2002 | Biberger et al. | 438/584 |
| 2002/0014257 A1 | 2/2002 | Chandra et al. | 134/19 |
| 2002/0055323 A1 | 5/2002 | McClain et al. | 451/41 |
| 2002/0074289 A1 | 6/2002 | Sateria et al. | 210/664 |
| 2002/0081533 A1 | 6/2002 | Simons et al. | 430/325 |
| 2002/0088477 A1 | 7/2002 | Cotte et al. | 134/2 |
| 2002/0098680 A1 | 7/2002 | Goldstein et al. | 438/625 |
| 2002/0106867 A1 | 8/2002 | Yang et al. | 438/458 |
| 2002/0112740 A1 | 8/2002 | DeYoung et al. | 134/3 |
| 2002/0112746 A1 | 8/2002 | DeYoung et al. | 134/36 |
| 2002/0115022 A1 | 8/2002 | Messick et al. | 430/311 |
| 2002/0117391 A1 | 8/2002 | Beam | 203/81 |
| 2002/0123229 A1 | 9/2002 | Ono et al. | 438/706 |
| 2002/0127844 A1 | 9/2002 | Grill et al. | 438/622 |
| 2002/0132192 A1 | 9/2002 | Namatsu | 430/322 |
| 2002/0141925 A1 | 10/2002 | Wong et al. | 428/262 |
| 2002/0142595 A1 | 10/2002 | Chiou | 438/689 |
| 2002/0150522 A1 | 10/2002 | Heim et al. | 422/190 |
| 2002/0164873 A1 | 11/2002 | Masuda et al. | 438/689 |
| 2003/0003762 A1 | 1/2003 | Cotte et al. | 438/745 |
| 2003/0008238 A1 | 1/2003 | Goldfarb et al. | 430/272.1 |
| 2003/0008518 A1 | 1/2003 | Chang et al. | 438/745 |
| 2003/0013311 A1 | 1/2003 | Chang et al | 438/704 |
| 2003/0036023 A1* | 2/2003 | Moreau et al. | 430/324 |
| 2003/0047533 A1 | 3/2003 | Reid et al. | 216/24 |
| 2003/0051741 A1 | 3/2003 | DeSimone et al. | |
| 2003/0106573 A1 | 6/2003 | Masuda et al. | 134/26 |
| 2003/0125225 A1 | 7/2003 | Xu et al. | 510/175 |
| 2003/0198895 A1 | 10/2003 | Toma et al. | 430/314 |
| 2003/0205510 A1 | 11/2003 | Jackson | 210/86 |
| 2003/0217764 A1 | 11/2003 | Masuda et al. | 134/26 |
| 2004/0011386 A1 | 1/2004 | Seghal | 134/26 |
| 2004/0018452 A1 | 1/2004 | Schilling | 430/314 |
| 2004/0020518 A1 | 2/2004 | DeYoung et al. | 134/30 |
| 2004/0087457 A1 | 5/2004 | Korzenski et al. | 510/177 |
| 2004/0103922 A1 | 6/2004 | Inoue et al. | 134/26 |
| 2004/0112409 A1 | 6/2004 | Schilling | 134/26 |
| 2004/0134515 A1* | 7/2004 | Castrucci | 134/2 |
| 2004/0177867 A1 | 9/2004 | Schilling | 134/26 |
| 2004/0211440 A1 | 10/2004 | Wang et al. | 134/2 |
| 2004/0259357 A1 | 12/2004 | Saga | 438/689 |
| 2005/0191865 A1 | 9/2005 | Jacobsen et al. | 438/780 |
| 2006/0003592 A1 | 1/2006 | Gale et al. | 438/745 |

FOREIGN PATENT DOCUMENTS

| | | |
|---|---|---|
| EP | 0 391 035 A2 | 10/1990 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| JP | 60-192333 | 9/1985 |
| JP | 1-045131 | 2/1989 |
| JP | 8-186140 | 7/1996 |
| JP | 8-222508 | 8/1996 |
| WO | WO90/06189 | 6/1990 |
| WO | WO93/14255 | 7/1993 |
| WO | WO93/14259 | 7/1993 |
| WO | WO93/20116 | 10/1993 |
| WO | WO96/27704 | 9/1996 |
| WO | WO99/49998 | 10/1999 |
| WO | WO 00/73241 A1 | 12/2000 |
| WO | WO 01/33613 A2 | 5/2001 |
| WO | WO 02/09894 A2 | 2/2002 |
| WO | WO 02/11191 A2 | 2/2002 |
| WO | WO 02/16051 A2 | 2/2002 |

OTHER PUBLICATIONS

"NSF/SRC Engineering Research Center for Environmentally Benign Semiconductor Manufacturing", http://www.erc.arizoma.edu/seminar/schedule2003.htm, May 15, 2003, 1 page.

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.

"Los Almos National Laboratory," Solid State Technology, pp. S10 & S14, Oct. 1998.

"Supercritical Carbon Dioxide Resist Remover, SCORR, the Path to Least Photoresistance," Los Almos National Laboratory, 1998.

Guan, Z. et al., "Fluorocarbon-Based Heterophase Polymeric Materials. I. Block Copolymer Surfactants for Carbon Dioxide Applications," Macromolecules, vol. 27, 1994, pp. 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp. 1585-1591.

Kirk-Othmer, "Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$," NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer systems," Polimery, pp. 65-73, Feb. 1998, Abstract Only.

Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284-291, Jan. 1998.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatograhy A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y, et al., "Decomposition of Tetramethylammonium (TMA) in a Positive Photo-resist Developer by Supercritical Water," Abstracts of Papers 214th ACS Natl Meeting, Americam Chemical Society, Abstract No. 108, Sep. 7, 1997.

Klein, H. et al., "Cyclic Organic Carbonates Serve as Solvents and Reactive Diluents," Coatings World, pp. 38-40, May 1997.

Bühler, J. et al., Linear Array of Complementary Metal Oxide Semiconductor Souble-Pass Metal Micro-mirrors, Opt. Eng., vol. 36, No. 5, pp. 1391-1398, May 1997.

Jo, M.H. et al., Evaluation of SIO2 Aerogel Thin Film with Ultra Low Dielectric Constant as an Intermetal Dielectric. Microelectronic Engineering, vol. 33, pp. 343-348, Jan. 1997.

McClain, J.B. et al., "Design of Nonionic Surfactants for Supercritical Carbon Dioxide," Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical CO2," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development,", SPIE, vol. 2724, pp. 410-417, Jun. 1996.

Schimek, G. L. et al., "Supercritical Ammonia Synthesis and Characterization for Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3, pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging, ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins,"SPIE, vol. 2438, pp. 250-260, Jun. 1995.

Wood, P.T. et al., "Synthesis of New Channeled Structures in Supercritical Amines . . . ," Inorg. Cehm., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPLE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films,"Chem. Mater., vol. 4, No. 4, pp., 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991, Abstract Only.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American college of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al, "A Super Low-k (k=1.1) Silica Aerogel Film Using Supercritical Drying Technique", IEEE, pp. 143-145, 2000.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", chem. Mater. 12, 41 (2000).

* cited by examiner (1) $(CH_3)_3Si\text{-}NH\text{-}Si(CH_3)_3 + HO\text{-}Si\equiv_{(s)} \rightarrow (CH_3)_3\text{---}Si\text{---}O\text{---}Si\equiv_{(s)}$ (2) $(CH_3)_3\text{-}SiNH_{2(g)} + (HO\text{-}Si)\equiv_{(s)} \rightarrow (CH_3)_3\text{---}Si\text{---}O\text{---}Si\equiv_{(s)} + NH_{2(g)}$

METHOD OF PASSIVATING OF LOW DIELECTRIC MATERIALS IN WAFER PROCESSING

RELATED APPLICATION(S)

This Patent Application claims priority under 35 U.S.C. 119 (e) of the co-pending U.S. Provisional Patent Application Ser. No. 60/361,917 filed Mar. 4, 2002, and entitled "METHODS OF PASSIVATING POROUS LOW-K DIELECTRIC FILM" and the co-pending U.S. Provisional Patent Application Ser. No. 60/369,052 filed Mar. 29, 2002, and entitled "USE OF SUPERCRITICAL $CO^2$ PROCESSING FOR INTEGRATION AND FORMATION OF ULK DIELECTRICS". The Provisional Patent Application Ser. No. 60/361,917 filed Mar. 4, 2002, and entitled "METHODS OF PASSIVATING POROUS LOW-K DIELECTRIC FILM" and the Provisional Patent Application Ser. No. 60/369,052 filed Mar. 29, 2002, and entitled "USE OF SUPERCRITICAL $CO_2$ PROCESSING FOR INTEGRATION AND FORMATION OF ULK DIELECTRICS" are also both hereby incorporated by reference.

FIELD OF THE INVENTION

The present invention relates to the field of micro-device processing. More particularly, the present invention relates to passivating low dielectric materials with supercritical processing solutions.

BACKGROUND OF THE INVENTION

Semiconductor fabrication generally uses photoresist in etching and other processing steps. In the etching steps, a photoresist masks areas of the semiconductor substrate that are not etched. Examples of the other processing steps include using a photoresist to mask areas of a semiconductor substrate in an ion implantation step or using the photoresist as a blanket protective coating of a processed wafer or using the photoresist as a blanket protective coating of a MEMS (micro electro-mechanical system) device.

State of the art integrated circuits can contain up to 6 million transistors and more than 800 meters of wiring. There is a constant push to increase the number of transistors on wafer-based integrated circuits. As the number of transistors is increased there is a need to reduce the cross-talk between the closely packed wire in order to maintain high performance requirements. The semiconductor industry is continuously looking for new processes and new materials that can help improve the performance of wafer-based integrated circuits.

Materials exhibiting low dielectric constants of between 3.5-2.5 are generally referred to as low-k materials and porous materials with dielectric constant of 2.5 and below are generally referred to as ultra low-k (ULK) materials. For the purpose of this application low-k materials refer to both low-k and ultra low-k materials. Low-k materials have been shown to reduce cross-talk and provide a transition into the fabrication of even smaller integrated circuit geometries. Low-k materials have also proven useful for low temperature processing. For example, spin-on-glass materials (SOG) and polymers can be coated onto a substrate and treated or cured with relatively low temperature to make porous silicon oxide-based low-k layers. Silicon oxide-based herein does not strictly refer silicon-oxide materials. In fact there are a number of low-k materials which have silicon oxide and hydrocarbon components and/or carbon, wherein the formula is $SiO_xC_xH_z$, referred to herein as hybrid materials and designated herein as MSQ materials. It is noted, however, that MSQ is often designated to mean Methyl Silsesquioxane, which is an example of the hybrid low-k materials described above. Some low-k materials such as carbon doped oxide (COD) or fluoridated silicon glass (FSG), are deposited using chemical vapor deposition techniques, while other low-k materials, such as MSQ, porous-MSQ, and porous silica, are deposited using a spin-on process.

While low-k materials are promising materials for fabrication of advanced micro circuitry, they also provide several challenges they tend be less robust that more traditional dielectric layer and can be damaged by etch and plasma ashing process generally used in pattern dielectric layer in wafer processing, especially in the case of the hybrid low-k materials, such as described above. Further, silicon oxide-based low-k materials tend to be highly reactive after patterning steps. The hydrophillic surface of the silicon oxide-based low-k material can readily absorb water and/or react with other vapors and/or process contaminants which can alter the electrical properties of the dielectric layer itself and/or diminish the ability to further process the wafer.

What is needed is a method of passivating a low-k layer especially after a patterning steps. Preferably, the method of passivating the low-k layer is compatible with other wafer processing steps, such as processing steps for removing contaminants and/or post-etch residue after a patterning step.

SUMMARY OF THE INVENTION

The present invention is directed to passivating silicon-oxide based low-k materials using a supercritical passivating solution. Low-k materials are usually porous oxide-based materials and can include an organic or hydrocarbon component. Examples of low-k materials include, but are not limited to, carbon-doped oxide (COD), spin-on-glass (SOG) and fluoridated silicon glass (FSG) materials. In accordance with the embodiments of the present invention, a supercritical passivating solution comprises supercritical carbon dioxide and an amount of a passivating agent that is preferably a silylating agent. The silylating agent can be introduced into supercritical carbon dioxide neat or with a carrier solvent, such as N, -dimethylacetamide (DMAC), gamma-butyrolactone (BLO), dimethyl sulfoxide (DMSO), ethylene carbonate (EC) N-methylpyrrolidone (NMP), dimethylpiperidone, propylene carbonate, alcohol or combinations thereof, to generate the supercritical passivating solution. In accordance with a preferred embodiment of the invention, the silylating agent is an organosilicon compound, and silyl groups $(Si(CR_3)_3)$ attack silanol (Si—OH) groups on the surface of the silicon oxide-based low-k dielectric material and/or in the bulk of the silicon oxide-based low-k dielectric material to form surface capped organo-silyl groups during the passivating step.

In accordance with further embodiments of the invention, a silicon oxide-based low-k material is passivated with a supercritical passivating solution comprising supercritical carbon dioxide and an organosilicon compound that comprises organo-groups with 5 carbon atoms or fewer. In accordance with a preferred embodiment of the invention the organo-groups, or a portion thereof, are methyl groups. For example, suitable organosilicon compounds useful as silylating agents in the present invention include, but are not limited to, hexamethyldisilazane (HMDS) and chlorotrimethylsilane (TMCS), trichloromethylsilane (TCMS) and combinations thereof. Alternatively, a source of $(CH_3)$ radicals can be used to as a silylating agent.

During a supercritical passivating step, a silicon oxide-based low-k material, in accordance with the embodiments of the invention, is maintained at temperatures in a range of 40 to 200 degrees Celsius, and preferably at a temperature of approximately 150 degrees Celsius, and at pressures in a range of 1,070 to 9,000 psi, and preferably at a pressure of approximately 3,000 psi, while a supercritical passivating solution, such as described above, is circulated over the surface of the silicon oxide-based low-k material.

In accordance with still further embodiments of the invention, the surface of the silicon oxide-based low-k material is dried or retreated prior to the passivating step. In accordance with this embodiment of the invention, the silicon oxide-based low-k material is dried, or retreated by exposing the low-k materials to a supercritical solution of supercritical carbon dioxide or supercritical carbon dioxide with one or more solvents including but not limited to ethanol, methanol, n-hexane and combinations thereof. While a supercritical processing solution with methanol and ethanol primarily remove water from low-k materials, a supercritical processing solution with n-hexane is believed to remove hydroxyl groups from low-k materials and facilitate the ability of a silylating agent, or agents, to silylate the low-k materials in the passivation processing step.

In accordance with yet further embodiments of the invention, a dielectric surface is passivated during a cleaning processing step, wherein a post-etch residue is simultaneously removed from the dielectric surface using a supercritical cleaning solution comprising a passivating agent, such as described above. The post-etch residue can include a photoresist polymer or a photoresist polymer with an anti-reflective dye and/or an anti-reflective layer.

In accordance with the method of the present invention, a patterned low-k dielectric layer is formed by depositing a continuous layer of a low-k dielectric material, etching a pattern in the low-k material and removing post-etch residue using a supercritical solution comprising supercritical carbon dioxide and a silicon-based passivating agent.

After a low-k material is patterned by treating the low-k material to an etch and/or ash process, the low-k material can show a marked increase in the k-values as a result of degeneration of the material and/or removal of a portion of the organic component, in the case of low-k hybrid materials; increases in k-values that are greater than 1.0 have been observed. The method of passivation, in accordance with the present invention has the ability to restore or recover a portion of the of the k-value lost in the patterning steps. In fact it has been observed that low-k materials passivated, in accordance with the embodiments of the present invention can be restored to exhibit k-values near, or at, k-values of the original and un-patterned material.

Further details of supercritical systems suitable for treating wafer substrates to supercritical processing solutions are further described in U.S. patent application Ser. No. 09/389,788, filed Sep. 3, 1999, and entitled "REMOVAL OF PHOTORESIST AND PHOTORESIST RESIDUE FROM SEMICONDUCTORS USING SUPERCRITICAL CARBON DIOXIDE PROCESS" and U.S. patent application Ser. No. 09/697,222, filed Oct. 25, 2000, and entitled "REMOVAL OF PHOTORESIST AND RESIDUE FROM SUBSTRATE USING SUPERCRITICAL CARBON DIOXIDE PROCESS", both of which are hereby incorporated by reference.

DETAILED DESCRIPTION OF THE
PREFERRED EMBODIMENT

In semiconductor fabrication, a dielectric layer is generally patterned using a photoresist mask in one or more etching and ashing steps. Generally, to obtain the high resolution line widths and high feature aspect ratios, an anti-reflective coating is required. In earlier processes, anti-reflective coating (ARC) of titanium nitride (TiN) were vapor deposited on the dielectric layer and the TiN anti-reflective coatings would not be removed after patterning but rather remain a part of the device fabricated. With new classes of low dielectric layers that can be made to be very thin, TiN anti-reflective coatings are not preferred because anti-reflective coatings can dominate over the electrical properties of the dielectric layer. Accordingly, polymeric spin-on anti-reflective coatings with an anti-reflective dye that can be removed after a patterning step are preferred. Regardless of the materials that are used in the patterning steps, after patterning the dielectric layer these materials are preferably removed from the dialectic layer after the patterning process is complete.

Porous low-k materials are most commonly silicon-oxide based with silanol (Si—OH) groups and/or organo components as described above. These low-k materials can become activated and/or damaged, which is believed to be in-part is due to depletion of an organic component during etch and/or ash steps. In either case of activation and/or damage, additional silanol groups are exposed which can readily adsorb water and/or contaminants and/or chemicals that are present during other processing steps. Accordingly, partial device structures with exposed low-k dielectric layers are difficult to handle and maintain contaminant free, especially after patterning steps. Further, activation and/or damage the bulk of the low-k material can result in increased k-values. It has been observed low-k materials that are activated and/or damaged can exhibit increases in k-values by 1.0 or more.

The present invention is directed to a method of and system for passivating porous low-k dielectric materials. The method of the present invention preferably passivates a layer of patterned low-k layer by end-capping silanol groups on the surface and/or in the bulk of the low-k material to produce a patterned low-k material which is more hydrophobic, more resistant to contamination and/or less reactive. In accordance with the embodiments of the present invention, a passivation processing step is carried out separately from a supercritical post-etch cleaning process or, alternatively, is carried out simultaneously with a supercritical post-etch cleaning process.

Figure 1A:
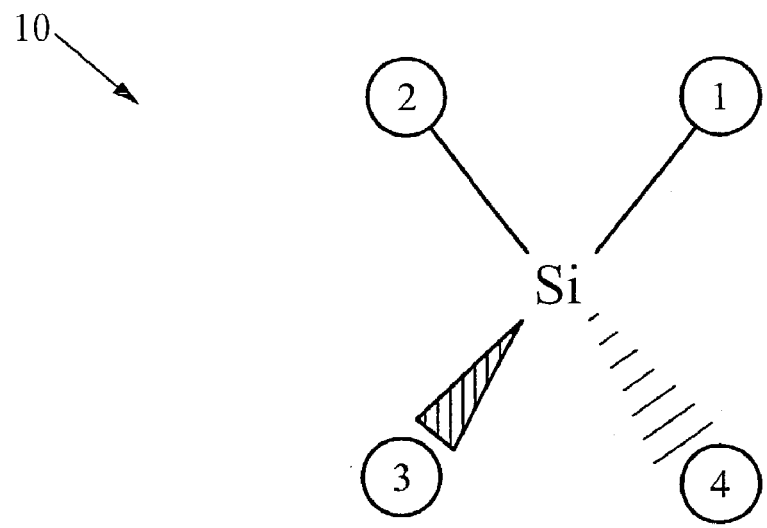
FIGS. 1A-C show schematic representations of organo-silicon structures used as silylating agents in a supercritical processing step, in accordance with the embodiments of the invention.

Referring now to FIG. 1A, in accordance with the embodiments of the invention, a supercritical passivating solution comprises a silane structure 10 which can have all organo groups, such as in the case with hexamethyldisilazane (HMDS) or a combination of organo and halide groups (F, Cl, Br and etc.) which are attached to any one of the positions 1-4.

Figure 1B:
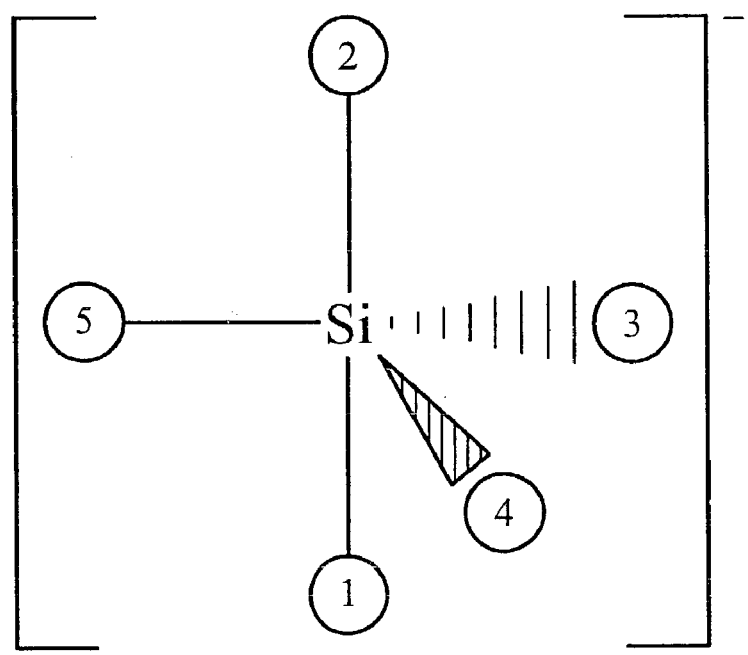

Now referring to FIG. 1B, in accordance with further embodiments of the invention, a supercritical passivating solution comprises a pent-valent organosilicon compound 20, wherein the silicon atom is coordinated to 5 ligands in the positions 1, 2, 3, 4 and 5 in a tiganolbipyramidal configuration. Typically such compounds 20 are anions with one or more of the positions 1-5 being coordinated with halide atom, such as in the case with a difluorotrimethylilicate anion. When the structure 20 is an anion, the compound 20 also includes a suitable cation, such as sodium, potassium or any other inorganic or organic cation (not shown).

Figure 1C:
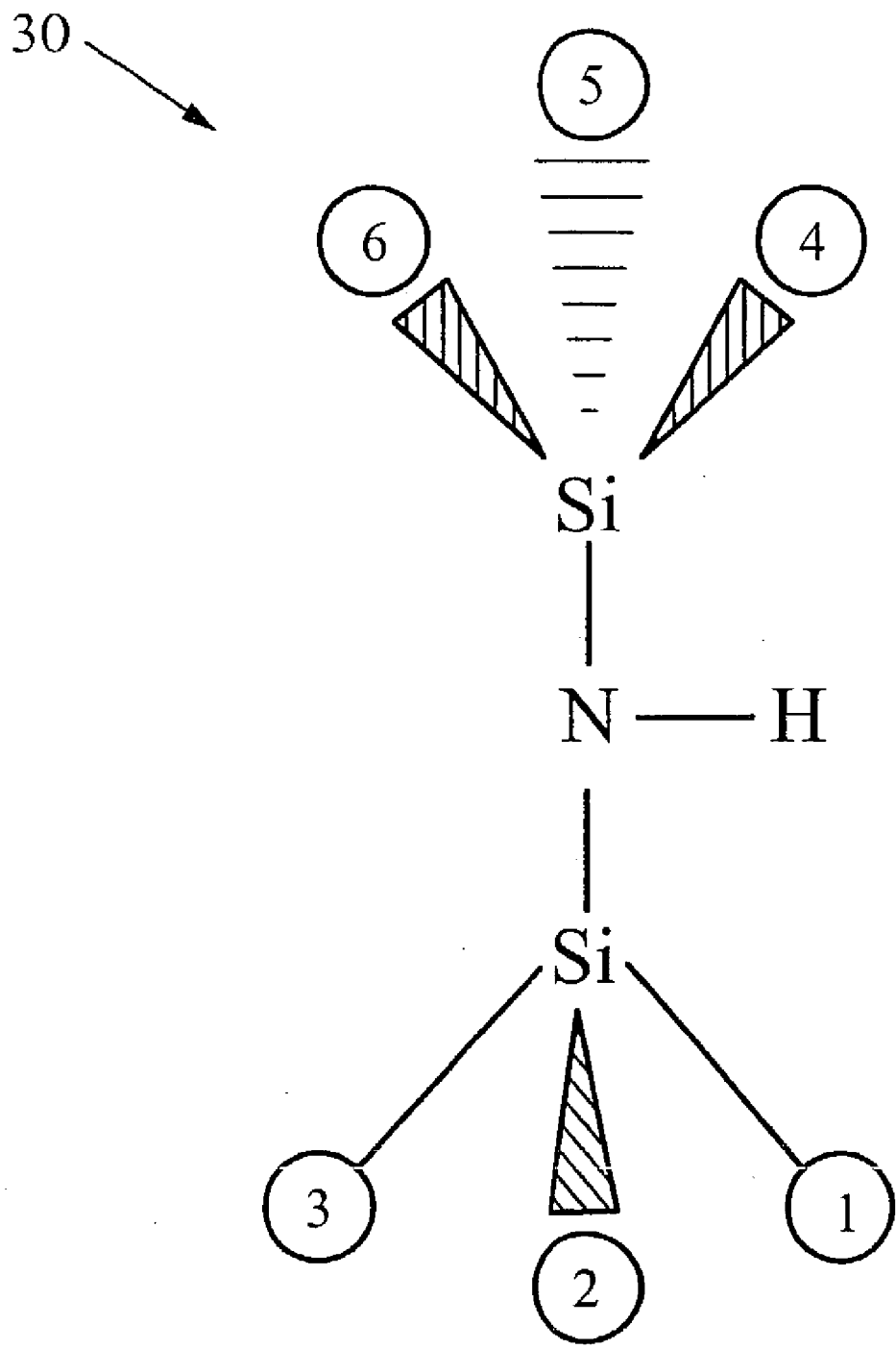

Now referring FIG. 1C, in accordance with yet further embodiments of the present invention, a supercritical passivating solution comprises a silazane structure 30, which can be described as an amine structure with two organosilyl groups coordinated to the nitrogen of the amine, such as in the case of hexamethyldisilazane (HMDS).

Figures 1D, 1E:
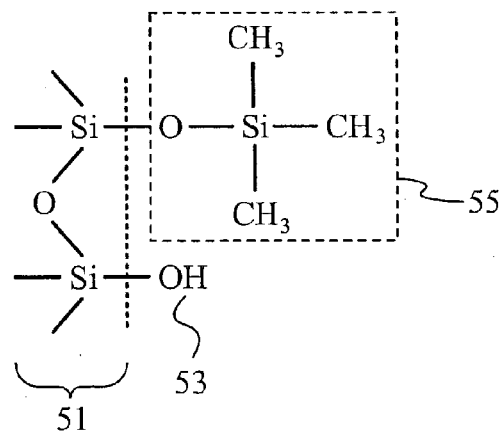
FIG. 1D shows schematic representations of silylating agents reacting with silanol groups in a low-k material, in accordance with the embodiments of the invention.
FIG. 1E illustrates steric hindrance between a silanol-group and a silyl-group on a surfaces of a low-k material, which can lead to incomplete silylating of the surface.

FIGS. 1D shows schematic representations of hexamethyldisilazane (HMDS) reacting with silanol groups on a surface of a low-k material in reaction sequence (1) and trimethyldisilazane (TMDS) reacting with silanol groups on a surface of the low-k material in reaction sequence (2). Note that trimethyldisilazane (TMDS) is a product in the reaction sequence (1), which can then further react with silanol groups on a surface of the low-k material in accordance with reaction sequence (2). Hence, hexamethyldisilazane (HMDS) provides is a excellent silylating agent for use in accordance with the method of the present invention.

FIG. 1E illustrates steric hindrance between a silanol group 53 and silyl-group 55 on a surface 51 of a low-k material. Note that the silanol group 53 is extremely large and can actually provide a protective barrier for the silanol group 53. Accordingly, it is not general possible to completely silylate an entire surface or bulk of a low-k material. However, when the low-k material is pre-treated with a supercritical processing solution comprising supercritical carbon dioxide and n-hexane, it is believed that a greater percent of the silanol groups 53 are replace with silyl-groups 55 on the surface 51.

It will be clear to one skilled in the art that a supercritical passivating solution with any number of silylating agents and combinations of silylating agents are within the scope of the present invention. Further, the silylating agent or agents used can be can be introduced into supercritical carbon dioxide neat or along with a carrier solvent, such as N, N-dimethylacetamide (DMAC), gamma-butyrolacetone (BLO), dimethyl sulfoxide (DMSO), ethylene carbonate (EC) N-methylpyrrolidone (NMP), dimethylpiperidone, propylene carbonate, alcohol or combinations thereof to generate the supercritical passivating solution. Also, as explained previously the passivating agent or agents used in the present invention can be used in supercritical cleaning processes to remove post-etch residues from a surface of a patterned low-k material.

The present invention is particularly well suited for removing post-etch photopolymer from a wafer material and even more specifically is well suited to remove a post-etch photopolymer and/or a polymeric anti-reflective coating layer from a low-k silicon oxide-based layer, including low-k layers formed from porous MSQ and porous $SiO_2$ (e.g., Honeywell's NANOGLASS®), while simultaneously passivating a silicon oxide-based layer. For the purpose of simplicity, supercritical processing solutions are referred to herein as either a supercritical cleaning and/or a supercritical passivating solution.

Figure 2:
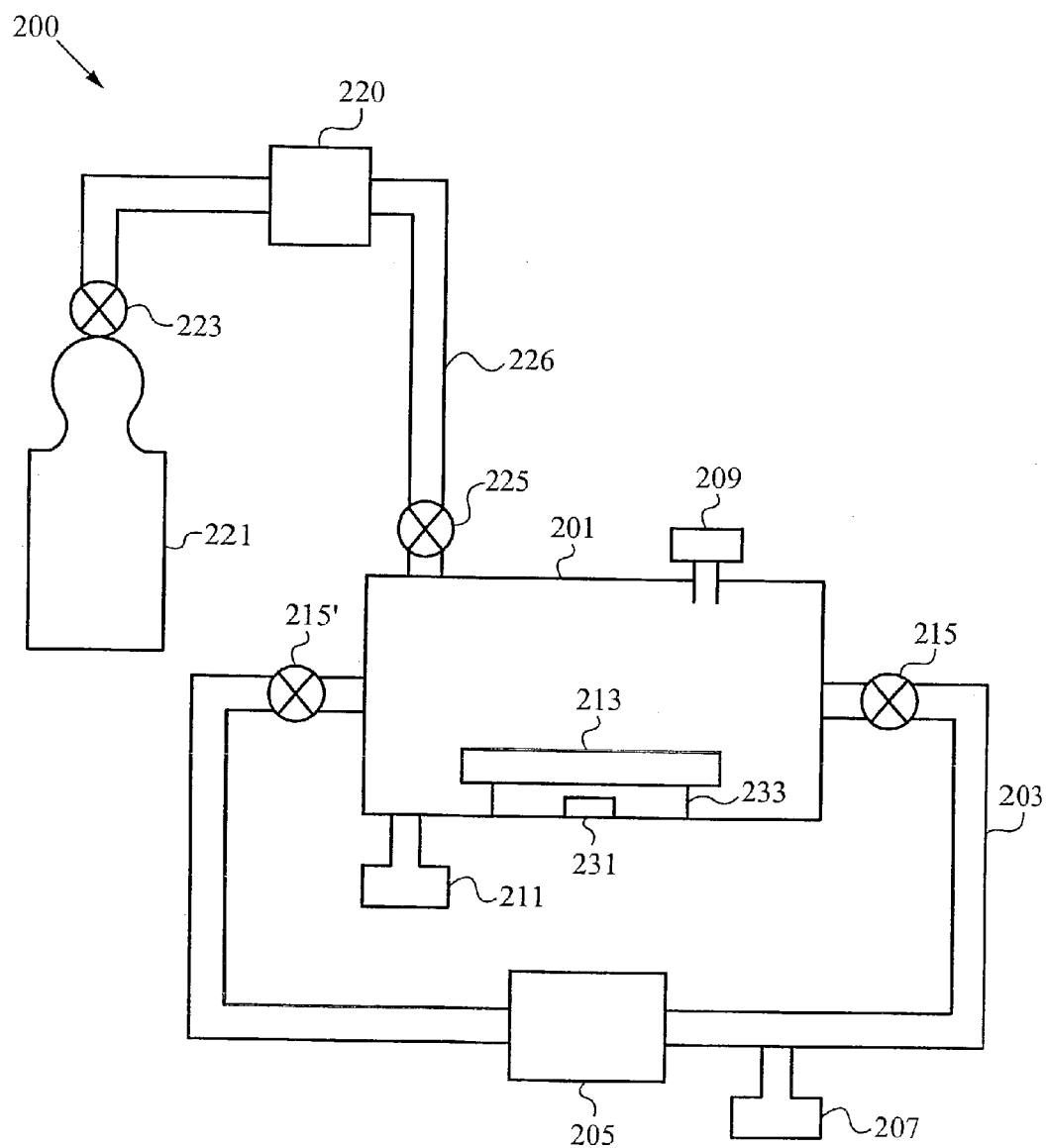
FIG. 2 shows a simplified schematic of a supercritical wafer processing apparatus, in accordance with the embodiments of the invention.

FIG. 2 shows a simplified schematic of a supercritical processing apparatus 200.

The apparatus 200 comprises a carbon dioxide source 221 that is connected to an inlet line 226 through a source valve 223 which can be opened and closed to start and stop the flow of carbon dioxide form the carbon dioxide source 221 to the inlet line 226. The inlet line 226 is preferably equipped with one or more back-flow valves, pumps and heaters, schematically shown by the box 220, for generating and/or maintaining a stream of supercritical carbon dioxide. The inlet line 226 also preferably has a inlet valve 225 that is configured to open and close to allow or prevent the stream of supercritical carbon dioxide from flowing into a processing chamber 201.

Still referring to FIG. 2, the process camber 201 is preferably equipped with one or more pressure valves 209 for exhausting the processing chamber 201 and/or for regulating the pressure within the processing chamber 201. Also, the processing chamber 201, in accordance with the embodiments of the invention is coupled to a pump and/or a vacuum 211 for pressurizing and/or evacuating the processing chamber 201.

Again referring to FIG. 2, within the processing chamber 201 of the apparatus 200 there is preferably a chuck 233 for holding an/or supporting a wafer structure 213. The chuck 233 and/or the processing chamber 201, in accordance with further the embodiments of the invention, has one or more heaters 231 for regulating the temperature of the wafer structure 213 and/or the temperature of a supercritical processing solution within the processing chamber 201.

The apparatus 200, also preferably has a circulation line or loop 203 that is coupled to the processing chamber 201. The circulation line 203 is preferably equipped with one or more valves 215 and 215' for regulating the flow of a supercritical processing solution through the circulation line 203 and through the processing chamber 201. The circulation line 203, is also preferably equipped with any number back-flow valves, pumps and/or heaters, schematically represent by the box 205, for maintaining a supercritical processing solution and flowing the supercritical process solution through the circulation line 203 and through the processing chamber 201. In accordance with a preferred embodiment of the invention, the circulation line 203 has an injection port 207 for introducing chemistry, such as a passivating agents and solvents, into the circulation line 203 for generating supercritical processing solutions in situ.

Figure 3:
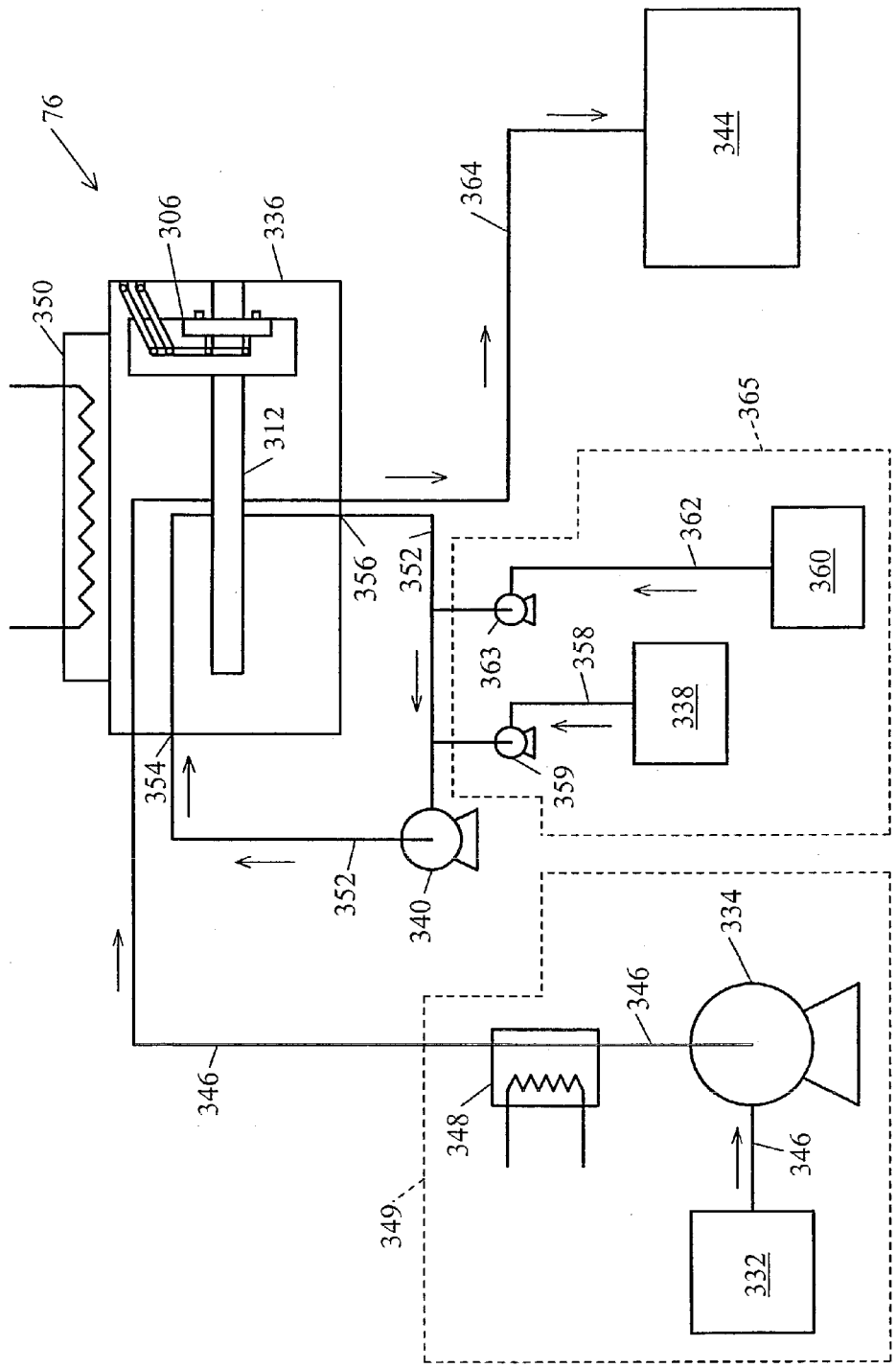
FIG. 3 shows a detailed schematic diagram of a supercritical processing apparatus, in accordance with the embodiments of the invention.

FIG. 3 shows a supercritical processing apparatus 76 in more detail than FIG. 2 described above. The supercritical processing apparatus 76 is configured for generating and for treating a wafer with supercritical cleaning, rinse and curing solutions. The supercritical processing apparatus 76 includes a carbon dioxide supply vessel 332, a carbon dioxide pump 334, the processing chamber 336, a chemical supply vessel 338, a circulation pump 340, and an exhaust gas collection vessel 344. The carbon dioxide supply vessel 332 is coupled to the processing chamber 336 via the carbon dioxide pump 334 and carbon dioxide piping 346. The carbon dioxide piping 346 includes a carbon dioxide heater 348 located between the carbon dioxide pump 334 and the processing chamber 336. The processing chamber 336 includes a processing chamber heater 350. The circulation pump 340 is located on a circulation line 352, which couples to the processing chamber 336 at a circulation inlet 354 and at a circulation outlet 356. The chemical supply vessel 338 is coupled to the circulation line 352 via a chemical supply line 358, which includes a first injection pump 359. A rinse agent supply vessel 360 is coupled to the circulation line 352 via a rinse supply line 362, which includes a second injection pump 363. The exhaust gas collection vessel 344 is coupled to the processing chamber 336 via exhaust gas piping 364.

The carbon dioxide supply vessel 332, the carbon dioxide pump 334, and the carbon dioxide heater 348 form a carbon dioxide supply arrangement 349. The chemical supply vessel 338, the first injection pump 359, the rinse agent supply vessel 360, and the second injection pump 363 form a chemical and rinse agent supply arrangement 365.

It will be readily apparent to one skilled in the art that the supercritical processing apparatus 76 includes valving, control electronics, filters, and utility hookups which are typical of supercritical fluid processing systems.

Still referring to FIG. 3, in operation a wafer (not shown) with a residue thereon is inserted into the wafer cavity 312 of the processing chamber 336 and the processing chamber 336 is sealed by closing the gate valve 306. The processing chamber 336 is pressurized by the carbon dioxide pump 334 with the carbon dioxide from the carbon dioxide supply vessel 332 and the carbon dioxide is heated by the carbon dioxide heater 348 while the processing chamber 336 is heated by the processing chamber heater 350 to ensure that a temperature of the carbon dioxide in the processing chamber 336 is above a critical temperature. The critical temperature for the carbon dioxide is 31° C. Preferably, the temperature of the carbon dioxide in the processing chamber 336 is within a range of range of from 40° C. to about 200° C., and preferably at or near to 150° C., during a supercritical passivating step.

Upon reaching initial supercritical conditions, the first injection pump 359 pumps the processing chemistry, such as a silylating agent, from the chemical supply vessel 338 into the processing chamber 336 via the circulation line 352 while the carbon dioxide pump further pressurizes the supercritical carbon dioxide. At the beginning of the addition of processing chemistry to the processing chamber 336, the pressure in the processing chamber 336 is preferably about 1,070 to 9,000 psi and preferably at or near 3,000 psi. Once a desired amount of the processing chemistry has been pumped into the processing chamber 336 and desired supercritical conditions are reached, the carbon dioxide pump 334 stops pressurizing the processing chamber 336, the first injection pump 359 stops pumping processing chemistry into the processing chamber 336, and the circulation pump 340 begins circulating the supercritical cleaning solution comprising the supercritical carbon dioxide and the processing chemistry. Preferably, the pressure within the processing chamber 336 at this point is about 3000 psi. By circulating the supercritical processing solution, supercritical processing solution is replenished quicky at the surface of the wafer thereby enhancing the rate of passivating the surface of a low-k dielectric layer on a wafer.

When a wafer (not shown) with a low-k layer is being processed within the pressure chamber 336, the wafer is held using a mechanical chuck, a vacuum chuck or other suitable holding or securing means. In accordance with the embodiments of the invention the wafer is stationary within the processing chamber 336 or, alternatively, is rotated, spun or otherwise agitated during the supercritical process step.

After the supercritical processing solution is circulated though circulation line 352 and the processing chamber 336, the processing chamber 336 is partially depressurized by exhausting some of the supercritical process solution to the exhaust gas collection vessel 344 in order to return conditions in the processing chamber 336 to near the initial supercritical conditions. Preferably, the processing chamber 336 is cycled through at least one such decompression and compression cycle before the supercritical processing solutions are completely exhausting the processing chamber 336 to the exhaust into the collection vessel 344. After exhausting the pressure chamber 336 a second supercritical process step is performed or the wafer is removed from the processing chamber 336 through the gate valve 306, and the wafer processing continued second processing apparatus or module (not shown).

Figure 4:
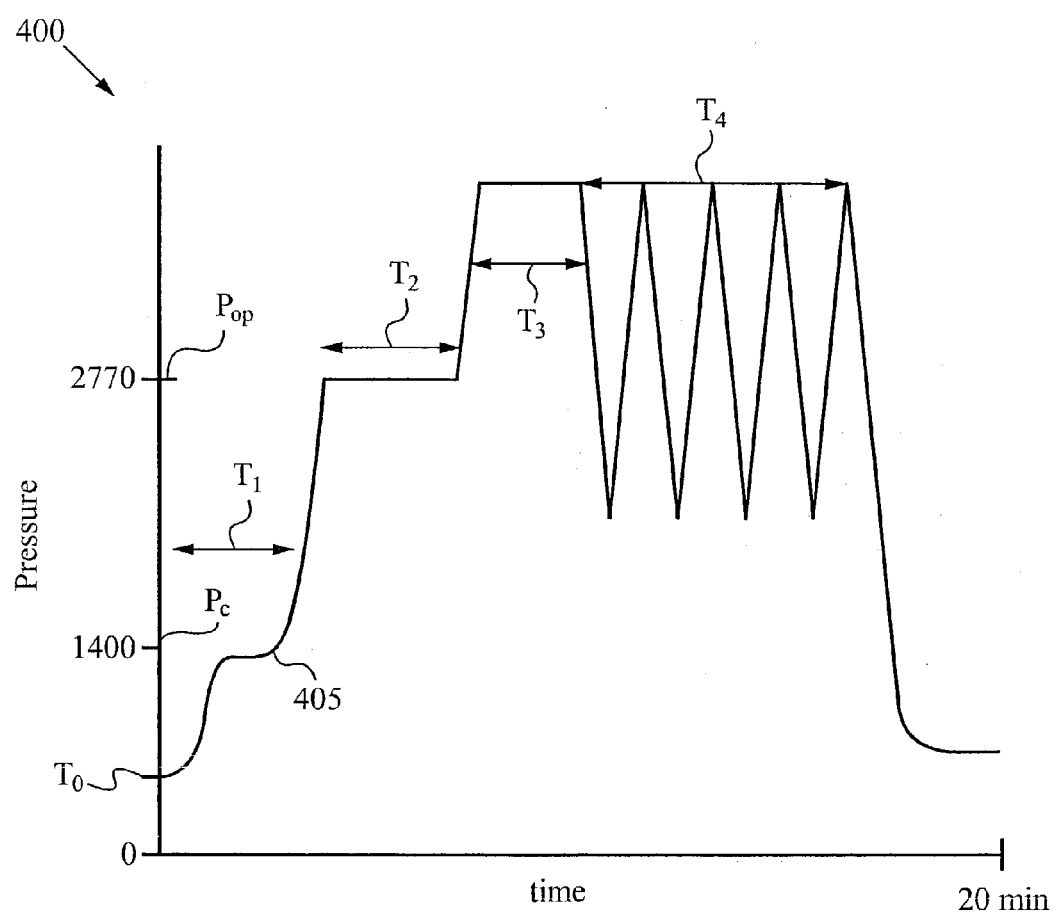
FIG. 4 is a plot of pressure versus time for a supercritical cleaning, rinse or curing processing step, in accordance with the method of the present invention.

FIG. 4 illustrates an exemplary plot 400 of pressure versus time for a supercritical process step, such as a supercritical cleaning/passivating process step, in accordance with the method of the present invention. Now referring to both FIGS. 3 and 4, prior to an initial time $T_0$, the wafer structure with post-etch residue thereon is placed within the processing chamber 336 through the gate valve 306 and the processing chamber 336 is sealed. From the initial time $T_0$ through a first duration of time $T_1$, the processing chamber 336 is pressurized. When the processing chamber 336 reached critical pressure $P_c$ (1,070 psi) then a processing chemistry including a silylating agents is injected into the processing chamber 236, preferably through the circulation line 352, as explained previously. The processing chemistry preferably includes hexamethyldisilazane (HMDS), chlorotrimethylsilane (TMCS), trichloromethylsilane (TMCS) and combinations thereof which are injected into the system. Several injections of process chemistries can be performed over the duration of time $T_1$ to generate a supercritical processing solution with the desired concentrations of chemicals. The processing chemistry, in accordance with the embodiments of the invention, can also include one more or more carrier solvents, ammine salts, hydrogen fluoride and/or other sources of fluoride. Preferably, the injection(s) of the process chemistries begin upon reaching about 1100-1200 psi, as indicated by the inflection pint 405. Alternatively, the processing chemistry is injected into the processing chamber 336 around the second time $T_2$ or after the second time $T_2$.

After processing chamber 336 reaches an operating pressure $P_{op}$ at the second time $T_2$ which is preferably about 3,000 psi, but can be any value so long as the operating pressure is sufficient to maintain supercritical conditions, the supercritical processing solution is circulated over and/or around the wafer and through the processing chamber 336 using the circulation line 325, such as described above. Then the pressure within the processing chamber 336 is increases and over the duration of time the supercritical processing solution continues to be circulated over and/or around the wafer and through the processing chamber 336 using the circulation line 325 and or the concentration of the supercritical processing solution within the processing chamber is adjusted by a push through process, as described below.

Still referring to FIG. 4, in a push-through process, over the duration of time $T_3$ a fresh stock of supercritical carbon dioxide fed into the processing chamber 336, while the supercritical cleansing solution along with process residue suspended or dissolved therein is simultaneously displaced from the processing chamber 336 through the vent line 364. After the push-through step is complete, then over a duration of time $T_4$, the processing chamber 336 is cycled through a plurality of decompression and compression cycles. Preferably, this is accomplished by venting the processing chamber 336 below the operating pressure $P_{op}$ to about 1,100-1,200 psi in a first exhaust and then raising the pressure within the processing chamber 336 from 1,100-1,200 psi to the operating pressure $P_{op}$ or above with a first pressure recharge. After, the decompression and compression cycles are complete, then the processing chamber is completely vented or exhausted to atmospheric pressure. For wafer processing, a next wafer processing step begins or the wafer is removed form the processing chamber and moved to a second process apparatus or module to continue processing.

The plot 400 is provided for exemplary purposes only. It will be understood by those skilled in the art that a supercritical processing step can have any number of different time/pressures or temperature profiles without departing from the scope of the present invention. Further any number of cleaning and rinse processing sequences with each step having any number of compression and decompression cycles are contemplated. Also, as stated previously, concentrations of various chemicals and species within a supercritical processing solution can be readily tailored for the application at hand and altered at any time within a supercritical processing step. In accordance with the preferred embodiment of the invention, a low-k layer is treated to 1 to 10 passivation steps in approximately 3 minute cycles, as described above with reference to FIGS. 3-4.

Figure 5A:
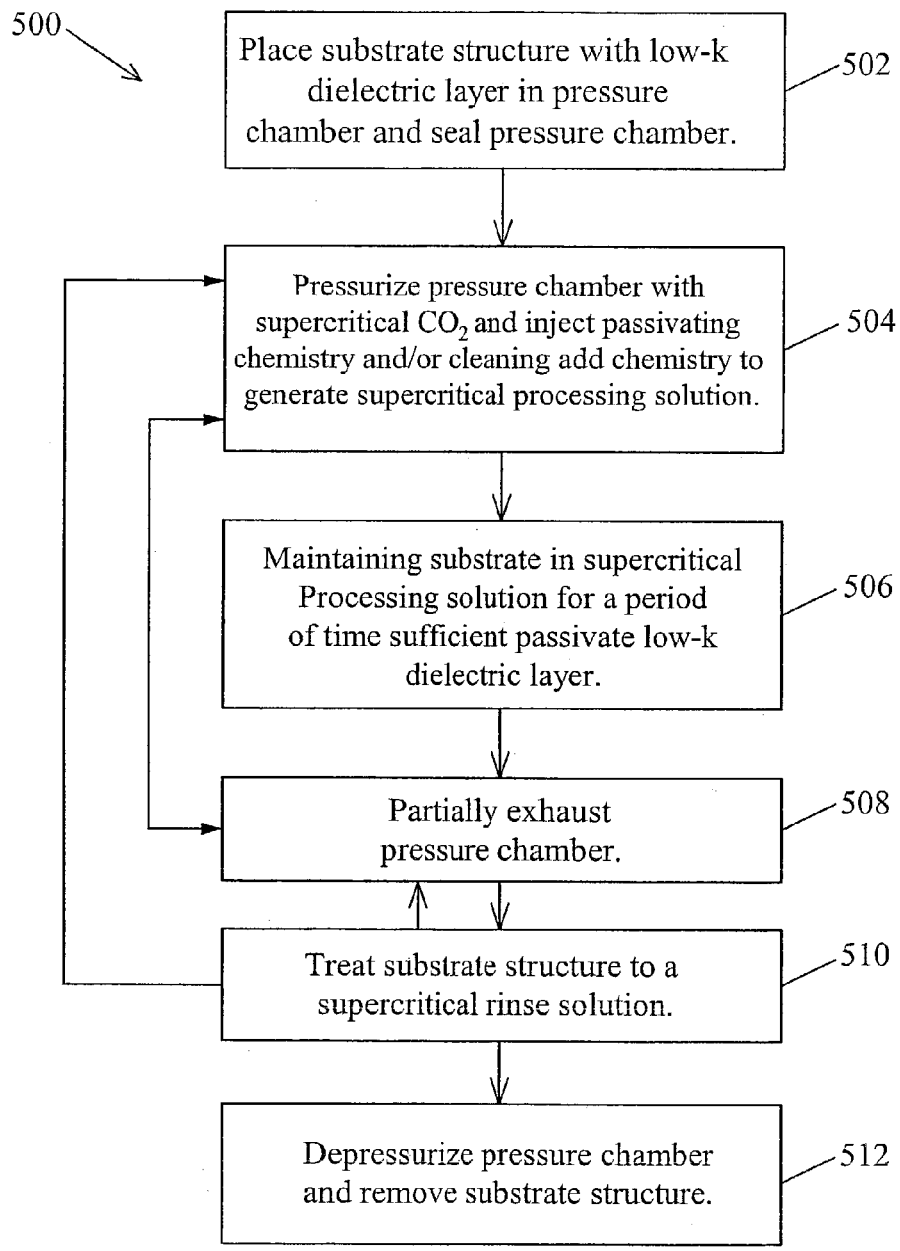
FIG. 5 is a schematic block diagram outlining steps for treating a silicon oxide-based low-k layer, in accordance with the embodiments of the present invention.

FIG. 5 is a block diagram 500 outlining steps for treating a substrate structure comprising a patterned low-k layer and post-etch residue thereon using a supercritical cleaning and passivating solution. In the step 502 the substrate structure comprising the post-etch residue is placed and sealed within a processing chamber. After the substrate structure is placed into and sealed within processing chamber in the step 502, in the step 504 the processing chamber is pressurized with supercritical $CO_2$ and processing chemistry is added to the supercritical $CO_2$ to generate a supercritical cleaning and passivating solution. Preferably, the cleaning and passivating chemistry comprises at least one organosilicon compound.

After the supercritical cleaning and passivating solution is generated in the step 504, in the step 506 the substrate structure is maintained in the supercritical processing solution for a period of time sufficient to remove at least a portion of the residue from the substrate structure and passivate surfaces exposed after the reside is removed. During the step 506, the supercritical cleaning and passivating solution is preferably circulated through the processing chamber and/or otherwise agitated to move the supercritical cleaning solution over surfaces of the substrate structure.

Still referring to FIG. 5, after at least a portion of the residue is removed from the substrate structure in the step 506, the processing chamber is partially exhausted in the step 508. The cleaning process comprising steps 504 and 506 are repeated any number of times, as indicated by the arrow connecting the steps 508 to 504, required to remove the residue from the substrate structure and passivate the surfaces exposed. The processing comprising steps 504 and 506, in accordance with the embodiments of the invention, use fresh supercritical carbon dioxide, fresh chemistry or both. Alternatively, the concentration of the cleaning chemistry is modified by diluting the processing chamber with supercritical carbon dioxide, by adding additional charges of cleaning chemistry or a combination thereof.

Still referring to FIG. 5, after the processing steps 504, 506 and 508 are complete, in the step 510 the substrate structure is preferably treated to a supercritical rinse solution. The supercritical rinse solution preferably comprises supercritical $CO_2$ and one or more organic solvents, but can be pure supercritical $CO_2$.

Still referring to FIG. 5, after the substrate structure is cleaned in the steps 504, 506 and 508 and rinsed in the step 510, in the step 512 the processing chamber is depressurized and the substrate structure is removed from the processing chamber. Alternatively, the substrate structure is cycled through one or more additional cleaning/rinse processes comprising the steps 504, 506, 508 and 510 as indicated by the arrow connecting steps 510 and 504. Alternatively, or in addition to cycling the substrate structure through one or more additional cleaning/rinse cycles, the substrate structure is treated to several rinse cycles prior to removing the substrate structure from the chamber in the step 512, as indicated by the arrow connecting the steps 510 and 508.

As described previously, the substrate structure can be dried and/or pretreated prior to passivating the low-k layer thereon by using a supercritical solution comprising supercritical carbon dioxide and one or more solvents such as methanol, ethanol, n-hexane and/or combination thereof. Also, as mentioned previously pretreating the low-k layer with supercritical solution comprising supercritical carbon dioxide and n-hexane appears to improve the coverage of the silyl-groups on surface of the low-k layer. Also, it will be clear of one skilled in the art that a wafer comprising a post-etch residue and/or a patterned low-k dialectic layer can be treated to any number cleaning and passivating steps and/or sequences.

It will be understood by one skilled in the art, that while the method of passivating low-k material has been primarily described herein with reference to a post-etch treatment and/or a post-etch cleaning treatment, the method of the present invention can be used to directly passivate low-k materials. Further, it will be appreciated that when treating a low-k material, in accordance with the method of the present invention, a supercritical rinse step is not always necessary and simply drying the low-k material prior treating the low-k material with a supercritical passivating solution can appropriate for some applications.

EXPERIMENTAL RESULTS

Using a supercritical processing system, such as described in detail above in reference to FIGS. 2 and 3, samples with a low-k layer formed form MSQ materials were treated with a silylating agent under several conditions. Under a first set of conditions, a sample with a layer of the low-k layer material was treated with a solution of hexane and approximately 6 percent TMCS. The sample was then annealed at approximately 100° C. for approximately 1.0 hr. Under a second set of conditions a sample with a layer of the low-k material was treated with a supercritical carbon dioxide passivating solution with approximately 1.0 percent TMCS at approximately 3,000 psi. Under yet a third set of conditions, a sample with a layer of the low-k material was treated with a supercritical dioxide passivating solution with approximately 1.0 percent TMCS at approximately 3,000 psi at 100° C. After treatment of the samples under the conditions described above, Fourier Transform Infrared Spectra of an untreated samples and each of the treated sample were collected. A comparative plot of the Fourier Transform Infrared Spectra collected are shown in FIGS. 6A-B.

Figure 6A:
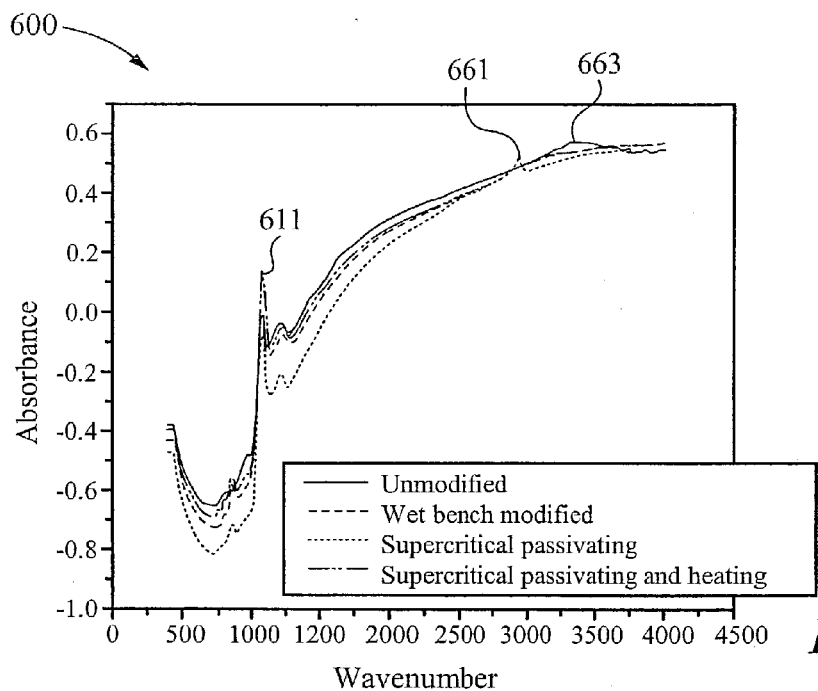
FIG. 6 shows infrared absorption spectra for a silicon-based low-k material before and after treatment with a passivating agent, in accordance with embodiments of the present invention.
Figure 6B:
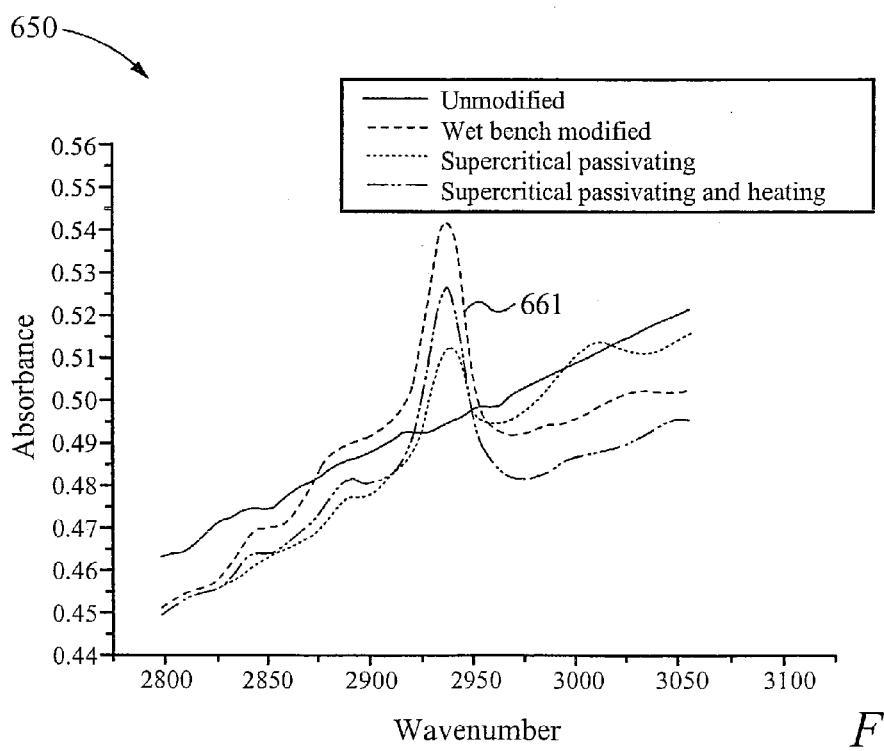

FIG. 6A plots the infrared spectra region from approximately 0 to 4,000 wave numbers. The peak 611 corresponds to the C—H stretching of the $Si(CH_3)_3$ groups, which has considerably increased for all of the samples treated with the silylating agent. The peak 661 corresponds to C—H bending of the $Si(CH_3)_3$ groups, which has also considerably increased for all of the samples treated with the silylating agent. FIG. 6B shows comparative plots of an expanded region of the infrared spectra shown in FIG. 6A, from approximately 2,800 wave numbers to 3,100 wave numbers to more clearly illustrate the increase in the peak 661 for the treated samples.

Still referring to FIG. 6A, the a broad peak 663 corresponding to O—H stretching, which is negligible in the in the treated samples, but is pronounced in the untreated sample. From spectra shown in FIGS. 6A-B, it is clear that TMCS is an effective silylating agent for the passivation of low-k material surfaces in both wet bench conditions and under supercritical processing conditions.

The present invention has the advantages of being capable of passivating a low-k surface and being compatible with other processing steps, such as removing post-etch residues (including, but not limited to, spin-on polymeric anti-reflective coating layers and photopolymers) for patterned low-k layers in a supercritical processing environment. The present invention also has been observed restore or partially restore k values of materials lost after patterning steps and has been shown to produce low-k layers that are stable over time.

While the present invention has been described in terms of specific embodiments incorporating details to facilitate the understanding of the principles of construction and operation of the invention, such references herein to specific embodiments and details thereof is not intended to limit the scope of the claims appended hereto. It will be apparent to those skilled in the art that modifications may be made in the embodiments chosen for illustration without departing from the spirit and scope of the invention. Specifically, while supercritical $CO_2$ is the preferred medium for cleaning, other supercritical media alone or in combination with supercritical $CO_2$ and combinations of hydrogen fluoride adducts are contemplated.

What is claimed is:

1. A method of treating a patterned surface of a low-k dielectric layer comprising:
    a removing post-etch residue from the patterned surface of the low-k dielectric layer using a supercritical processing solution comprising supercritical $CO_2$ and an amount of a silylating agent comprising organic groups; and
    b. removing the supercritical solution from the patterned surface of the low-k dielectric layer, wherein the patterned surface of the low-k dielectric layer is at least partially passivated with the organic groups from the processing solution, thereby at least partially restoring a k-value of the low-k dielectric layer to a pre-patterned value.

2. The method of claim 1, wherein the organic groups comprise alky groups.

3. The method of claim 1, wherein the organic groups comprise 5 carbon atoms or fewer.

4. The method of claim 1, wherein the silylating agent is selected from the group consisting of hexamethyldisilazane (HMDS), chlorotrimethylsilane (TMCS) and trichloromethylsilane (TCMS).

5. The method of claim 1, wherein the supercritical-processing solution further comprises a carrier solvent.

6. The method of claim 5, wherein the carrier solvent is selected from the group consisting of N, N-dimethylacetamide (DMAC), gamma-butyrolacetone (BLO), dimethyl sulfoxide (DMSO), ethylene carbonate (EC), N-methylpyrrolidone (NMP), dimethylpiperidone, propylene carbonate and alcohol.

7. The method of claim 1, wherein the low-k surface is maintained at temperatures in a range of 40 to 200 degrees Celsius.

8. The method of claim 1, wherein removing post-etch residue from the low-k dielectric surface to a supercritical processing solution comprises circulating the supercritical processing solution over the low-k surface.

9. The method of claim 1, wherein the supercritical processing solution is maintained at pressures in a range of 1,000 to 9,000 psi.

10. The method of claim 1, further comprising drying the low-k dielectric surface prior to removing post-etch residue from the low-k dielectric surface to a supercritical processing solution.

11. The method of claim 10, wherein drying the low-k dielectric surface comprises treating the low-k surface to a supercritical drying solution comprising supercritical carbon dioxide and n-hexane.

12. The method of claim 1, wherein the low-k surface comprises silicon-oxide.

13. The method of claim 1, wherein the low-k surface comprises a material selected from the group consisting of a carbon doped oxide, a spin-on-glass (SOG) and fluoridated silicon glass (FSG).

14. A method of treating a dielectric, comprising:
    a) removing post-etch residue from a surface of the dielectric using a supercritical cleaning solution, the dielectric having a k-value that is greater than an initial k-value; and
    b) treating the surface of the dielectric with a passivating agent in a supercritical cleaning solution to form a passivated dielectric with restoring a restored k-value being substantially near the initial k-value.

15. The method of claim 14, wherein the post-etch residue comprises a polymer.

16. The method of claim 15, wherein the polymer is a photoresist polymer.

17. The method of claim 16, wherein the photoresist polymer comprises an anti-reflective dye.

18. The method of claim 14, wherein the dielectric surface comprises silicon oxide.

19. The method of claim 14, wherein the dielectric surface comprises a material selected from the group consisting of a carbon doped oxide, a spin-on-glass (SOG) and fluoridated silicon glass (FSG).

20. The method of claim 14, wherein the post-etch residue comprises an anti-reflective coating.

21. The method of claim 20, wherein the anti-reflective coating comprises an organic spin-on anti-reflective material.

22. The method of claim 14, wherein the passivating agent comprises an organosilicon compound.

23. The method of claim 22, wherein the organosilicon compound is selected from the group consisting of hexamethyldisilazane (HMDS), chlorotrimethylsilane (TMCS) and trichloromethylsilane (TCMS).

24. A method of forming a patterned low-k dielectric layer, the method comprising:
 a. depositing a continuous layer of a low-k dielectric material with an initial k-value;
 b. forming a photoresist mask over the continuous layer of the low-k dielectric material;
 c. patterning the continuous layer of low-k dielectric material through the photoresist mask, thereby forming a post-etch residue and causing the low-k dielectric layer to have a k-value greater that of the initial k-value; and
 d. removing the post-etch residue using a supercritical solution comprising supercritical carbon dioxide and an organosilicon passivating agent, wherein the surface of the low-k dielectric material is passivated with organic groups from the organosilicon passivating agent thereby restoring the k-value to a k-value that is substantially near that of the initial k-value.

\* \* \* \* \*